(12) United States Patent
Chen et al.

(10) Patent No.: US 12,300,692 B2
(45) Date of Patent: May 13, 2025

(54) SEMICONDUCTOR DEVICE WITH ESD PROTECTION AND METHODS OF OPERATING AND CONFIGURING THE SAME

(71) Applicant: TAIWAN SEMICONDUCTOR MANUFACTURING COMPANY, LTD., Hsinchu (TW)

(72) Inventors: Chia-Hui Chen, Hsinchu (TW); Chia-Jung Chang, Hsinchu (TW); Bo-Ting Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 384 days.

(21) Appl. No.: 17/735,095

(22) Filed: May 2, 2022

(65) Prior Publication Data
US 2023/0215861 A1    Jul. 6, 2023

Related U.S. Application Data

(60) Provisional application No. 63/266,226, filed on Dec. 30, 2021.

(51) Int. Cl.
*H01L 27/02* (2006.01)
*H02H 9/04* (2006.01)

(52) U.S. Cl.
CPC ...... *H01L 27/0255* (2013.01); *H01L 27/0292* (2013.01); *H01L 27/0296* (2013.01); *H02H 9/046* (2013.01)

(58) Field of Classification Search
CPC ............ H01L 27/0255; H01L 27/0292; H01L 27/0296; H02H 9/046
USPC ........................................................ 361/56
See application file for complete search history.

(56) References Cited

U.S. PATENT DOCUMENTS

| | | | |
|---|---|---|---|
| 2007/0223163 A1* | 9/2007 | Hung | H01L 27/0251 361/93.1 |
| 2011/0026176 A1 | 2/2011 | Kim | |
| 2011/0063763 A1 | 3/2011 | Alvarez et al. | |
| 2014/0035091 A1* | 2/2014 | Smith | H01L 27/0255 257/499 |
| 2017/0110170 A1 | 4/2017 | Kong et al. | |
| 2017/0170165 A1* | 6/2017 | Chen | H01L 27/0629 |
| 2021/0281066 A1 | 9/2021 | Lee et al. | |

FOREIGN PATENT DOCUMENTS

| | | |
|---|---|---|
| TW | 201349749 | 12/2013 |
| TW | 201436407 | 9/2014 |

* cited by examiner

*Primary Examiner* — Kevin J Comber
(74) *Attorney, Agent, or Firm* — Hauptman Ham, LLP

(57) ABSTRACT

An electro-static discharge (ESD) protection network for an input/output (I/O) pad includes a driver stack including an upper branch and a lower branch, the upper branch being electrically connected between a first node that has a first reference voltage and the I/O pad, and the lower branch being electrically connected between the I/O pad and a second node that has a second reference voltage; a first ESD device electrically connected between the I/O pad and a third node that has a third reference voltage; and a power clamp between the third node and the second node.

20 Claims, 9 Drawing Sheets

US 12,300,692 B2

SEMICONDUCTOR DEVICE WITH ESD PROTECTION AND METHODS OF OPERATING AND CONFIGURING THE SAME

PRIORITY CLAIM

The present application claims the priority of U.S. Provisional Application No. 63/266,226, filed Dec. 30, 2021, which is incorporated herein by reference in its entirety.

BACKGROUND

The semiconductor integrated circuit (IC) industry produces a variety of analog and digital devices to address issues in several different areas. Developments in semiconductor process technology nodes have progressively reduced component sizes and tightened spacing resulting in progressively increased transistor density. As a result, ICs have become progressively smaller.

In mobile electronic devices, a fail-safe input/output (I/O) architecture is configured to reduce system standby leakage power while protecting against electrostatic discharge (ESD). Ideally, in the event of failure, a fail safe device responds in a way that causes no harm, or at least a minimum of harm, to other devices.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
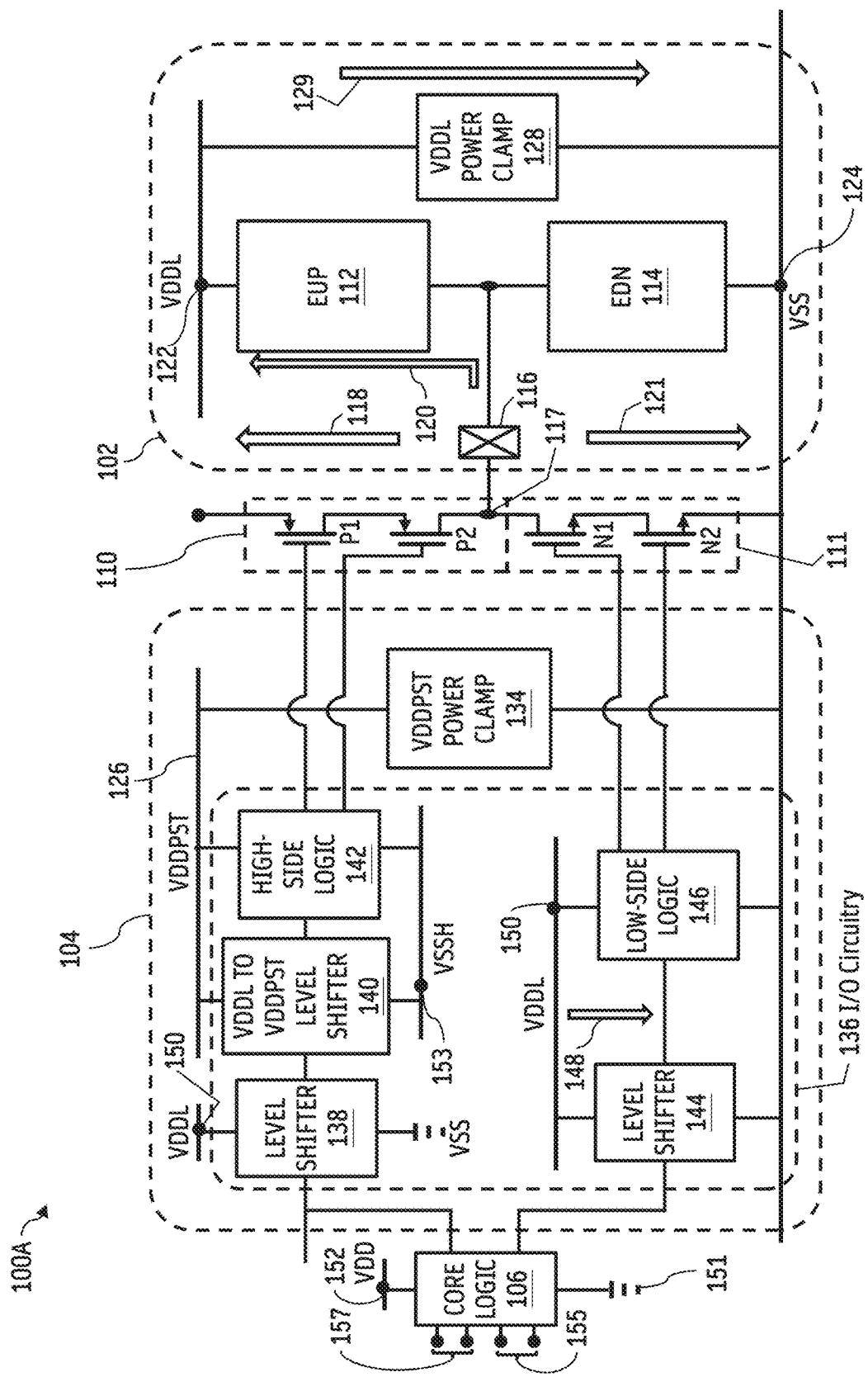
FIG. 1A is a block diagram of an electro-static discharge (ESD) protection network, in accordance with some embodiments.

The following disclosure provides many different embodiments, or examples, for implementing different features of the provided subject matter. Specific examples of elements and arrangements are described below to simplify the present disclosure. These are, of course, examples and are not intended to be limiting. For example, the formation of a first feature over or on a second feature in the description that follows includes embodiments in which the first and second features are formed in direct contact and includes embodiments in which additional features are formed between the first and second features, such that the first and second features are unable to be in direct contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly.

As used herein, although terms such as "first," "second" and "third" describe various elements, components, regions, layers and/or sections, these elements, components, regions, layers and/or sections are not limited by these terms. These terms are used to distinguish one element, component, region, layer, or section from another. Terms such as "first," "second" and "third" in response to used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that is contemplated by people having ordinary skill in the art. Alternatively, the terms "substantially," "approximately" and "about" mean within an acceptable standard error of the mean in response to considered by one of ordinary skill in the art. People having ordinary skill in the art understand that the acceptable standard error varies according to different technologies. Other than in the operating/working examples, or unless otherwise expressly specified, the numerical ranges, amounts, values, and percentages such as those for quantities of materials, durations of times, temperatures, operating conditions, ratios of amounts, and the likes thereof disclosed herein should be understood as modified in instances by the terms "substantially," "approximately" or "about." Accordingly, unless indicated to the contrary, the numerical parameters set forth in the present disclosure and attached claims are approximations that vary as desired. At the very least, each numerical parameter is construed considering the number of reported significant digits and by applying ordinary rounding techniques. Ranges are expressed herein as from one endpoint to another endpoint or between two endpoints. All ranges disclosed herein are inclusive of the endpoints, unless otherwise specified.

In some embodiments, an electro-static discharge (ESD) protection network for an input/output (I/O) pad includes a driver stack, a first ESD device and a power clamp. The driver stack has a serially-connected upper branch and a lower branch, the upper branch being electrically connected between a first node that has a first reference voltage (e.g., VDDPST) and the I/O pad, and the lower branch being electrically connected between the I/O pad and a second node that has a second reference voltage (e.g., VSS). The first ESD device (e.g., EUP device) is electrically connected between a first node and a third node that has a third reference voltage (e.g., VDDL). The power clamp is electrically connected between the third node and the second node. In some embodiments, the first ESD device includes a string of one or more, e.g., 2, diodes. In some embodiments, the ESD protection network further includes a second ESD device (e.g., EDN device) electrically connected between the I/O pad and the second node. In some embodiments, the second ESD device includes a string of one or more, e.g., 1, diodes. According to another approach, neither the first ESD device nor the second ESD device is provided, but instead a power clamp is provided between the first node and the second node as ESD protection. The power clamp according to the other approach uses gate tie-off drain-ballasting NMOS transistors. During normal operation, as contrasted with a fail safe mode for ESD-protection, the power clamp according to the other approach suffers/exhibits a substantial leakage current. By contrast, embodiments of the present application which include the first and second ESD devices exhibit smaller leakage current, and thus exhibit reduced power consumption, as compared to the power clamp according to the other approach.

Drain ballasting with larger poly-pitch according to the other approach is not process friendly in advanced process nodes such as nano-sheet processing. For example, the layout in drain ballasting transistors is different (i.e., has a larger poly-pitch) than those of neighboring transistors, and thus drain ballasting is problematic for advanced processes in which the poly-pitch is expected to be uniform for every transistor.

Snapback is a mechanism in a transistor in which avalanche breakdown or impact ionization provides a sufficient drain current to turn on the transistor. Snapback is used intentionally in the design of certain ESD protection devices integrated onto semiconductor chips. Snapback is also a parasitic failure mechanism which appears similar to latchup. Snapback is initiated by a small current from gate to drain. In the case of ESD protection devices, this current is caused by avalanche breakdown due to a sufficiently large voltage applied across the gate-drain junction. In the case of parasitic failures, the initiating current results from inadvertently turning on the transistor and a sufficiently large voltage across the gate and drain causing impact ionization, with some of the generated carriers then serving as the initiating current which flows into the drain. Once this initiating current flows into the drain, the transistor turns on and the gate voltage decreases to the snapback holding voltage. This voltage happens at the point where the processes of drain current generation and the transistor turning on are in balance: the gate-source current of the transistor decreases the drain voltage, which results in a lower electric field, which results in a smaller impact ionization or avalanche current and thus smaller base current, which weakens the action.

FIG. 1A is a block diagram of an electro-static discharge (ESD) protection network 100A, in accordance with some embodiments.

EDS protection network 100A includes a fail-safe I/O ESD circuit 102, an I/O unit 104, a core logic circuit 106, and a post-driver stack including a serially connected upper branch 110 and a lower branch 111.

Core logic circuit 106 is powered by VDD at a node 152 and is between node 152 and ground 151. In some embodiments, core logic circuit 106 is an integrated circuit (IC) that controls data transfer functions. In some embodiments, core logic circuit 106 is processing circuitry of a device or other suitable processing circuitry within the contemplated scope of the disclosure. Core logic circuit 106 receives input signals at pins 155 and/or 157 that are configured for first power domain according to a VDD reference voltage. Core logic circuit 106 routes the received signals to I/O unit 104.

I/O unit 104 includes I/O circuitry 136 and a VDDST power clamp 134. I/O circuitry 136 includes level shifters 138, 140, and 144, high-side logic device 142 and low-side logic device 146. Level shifters 138, 140 and 144 are circuits configured to translate signals from one logic level or voltage domain to another, facilitating compatibility between integrated circuits with different voltage requirements, such as TTL and CMOS. In some embodiments, level shifters serve to bridge power domains between processors, logic, sensors, and other circuits. Level shifter 144 receives one or more signals from core logic circuit 106 which are configured for the VDD-based power domain and shifts the same to have levels appropriate for a power domain based on a VDDL reference voltage and outputs the level-shifted signals to a low-side logic device 146. Low-side logic device 146 is a circuit configured to operate in the VDDL-based power domain and to output signals to the post-driver stack. Each of level shifter 144 and low side logic device 146 is located between node 150 at/having VDDL and node 124 at/having VSS.

Level shifter 138 receives one or more signals from core logic circuit 106 which are configured for the VDD-based power domain, shifts the same to have levels appropriate for a power domain based on the VDDL reference voltage, and outputs the level-shifted signals to level shifter 140. Level shifter 140 receives one or more signals from level shifter 138 which are configured for the VDDL-based power domain and shifts the same to have levels appropriate for a power domain based on VDD post-driver power (VDDPST) reference voltage. Level shifter 140 outputs the level-shifted signals to a high-side logic device 142. High-side logic circuit device 142 is a circuit configured to operate in the a VDDPST-based power domain and to output signals to the post-driver stack. Each of level shifter 140 and high-side logic device 142 is located between node 126 at/having VDDPST and node 153 at/having VSSH (e.g., a high-side logic ground). In some embodiments, VSS and VSSH are the same, VSSH is zero volts, VSSH is ground, or VSSH is other suitable voltages within the contemplated scope of the disclosure.

Upper branch 110 of the post-driver stack includes PMOS transistors P1 and P2. Lower branch 111 of the post-driver stack includes NMOS transistors N1 and N2. PMOS transistors P1 and P2 are connected in series between node 126 at/having VDDPST and a node 117. NMOS transistors N1 and N2 are connected in series between node 117 and node 124 at/having VSS. An I/O pad 116 is connected to node 117. PMOS transistors P1 and P2 receive gate inputs from high-side logic device 142. In response to the inputs from high-side logic device 142 being high, P1 and P2 will turn off. In response to the inputs from high-side logic device 142 being low, P1 and P2 will turn on. Transistor P1 is located between node 126 at/having VDDPST and transistor P2. In response to the inputs from low-side logic device 146 being high, P1 and P2 will turn on. In response to the inputs from low-side logic device 146 being low, P1 and P2 will turn off. In some embodiments, the post-driver stack circuit is a stack of transistors (e.g., P1, P2, N1, and N2) used to control other circuits. In some embodiments, the post-driver stack circuit includes a different number of PMOS and/or a different number of NMOS transistors. In some embodiments, there is a resistor in series between node 117 and I/O pad 116, e.g., for reliability and ESD concerns.

Fail-safe I/O ESD circuit 102 includes I/O pad 116, an EUP device 112, an EDN device 114 and a VDDL power clamp 128. In some embodiments, EUP is an acronym for ESD discharge up, and EDN is an acronym for ESD discharge down. I/O pad 116 is electrically connected between node 117 and EUP device 112 and EDN device 114. EUP device 112 is connected between I/O pad 116 and a node 122 at/having VDDL. EDN device 114 is connected between I/O pad 116 and node 124 at/having VSS. Each of EUP device 112 and EDN device 114 exhibits low leakage. In some embodiments, EUP device 112 includes a chain/string of diodes (see FIG. 1B). In some embodiments, EUP device 112 includes one or more diodes (see FIG. 1B).

VDDL power clamp 128 is connected between node 122 at/having VDDL and node 124 at/having VSS. VDDL power clamp 128 assists in protecting from ESD. VDDL power clamp 128 shunts ESD current (e.g., Iclamp 129) not dissipated by EUP device 112 from the VDDL power rail, i.e., from node 122 at/having VDDL, to the VSS power rail, i.e., node 124 at/having VSS.

VDDPST power clamp 134 is connected between node 126 at/having VDDPST and node 124 at/having VSS. VDDPST power clamp 134 assists in protecting from an over-voltage circumstance. When a voltage on node 126 rises above VDDPST, VDDPST power clamp 134 shunts current from the VDDPST power rail, i.e., from node 126 at/having VDDPST, to the VSS power rail, i.e., node 124 at/having VSS.

During a fail-safe mode of operation VDDPST is powered down to zero volts (e.g., a standby mode), and VDDL is either powered on by a power management unit (PMU) (not shown) or left floating. Regardless, receipt of an ESD voltage on I/O pad 116 upwardly biases VDDL through EUP device 112. In FIG. 1A, assuming that the level of the ESD voltage is smaller than the breakdown voltage of EDN device 114, current Istk_L 121 is substantially equal to the sum of currents Istk_U 118 and Iup 120 such that Istk_L≈Iskt_U+Iup.

In FIG. 1A, when VDDL is powered up by the PMU, there is leakage associated with VDDL including leakage current Istk_L 121 through lower branch 111 of the post-driver stack, leakage current Iclamp 129 through VDDL power clamp 128, leakage current Ipre 148 through low-side logic device 146 and/or level shifter 144, and leakage through VDDSPST power clamp 134. In some embodiments, the value of VDDL is reduced by the PMU to reduce leakage when VDDL is powered on. In some embodiments, to avoid stress on other devices, the value of VDDL is set to be greater than or equal to the voltage on I/O pad 116, namely VPAD, less the device operation voltage (e.g., voltage operation of fail-safe I/O ESD circuit 102).

In response to an ESD voltage on I/O pad 116 (under the assumption that the level of the ESD voltage is smaller than the breakdown voltage of EDN device 114), EUP device 112 conducts a current Iup 120 to node 122 which dissipates the ESD voltage so that the ESD voltage from I/O pad 116 is less than or equal to VDDL after passing through EUP device 112. In some embodiments, also in response to an ESD voltage on I/O pad 116, lower branch 111 of the post-driver stack also conducts a current Istk_L 121 through NMOS transistors N1 and N2. Such current dissipation ensures that an ESD event does not send a high voltage from I/O pad 116 to node 122 substantially above VDDL.

Regarding FIG. 1A, a method (in accordance with some embodiments) of protecting I/O circuitry includes: dissipating a voltage level of ESD on I/O pad 116; and wherein the dissipating includes passing a first current from I/O pad 116 through EUP device 112 to node 122 which reduces the voltage level of the ESD to be at or below a reference voltage otherwise on node 122 but for the ESD. Such a method further includes: passing the first current through VDDL power clamp 128 to node 124.

Figure 1B:
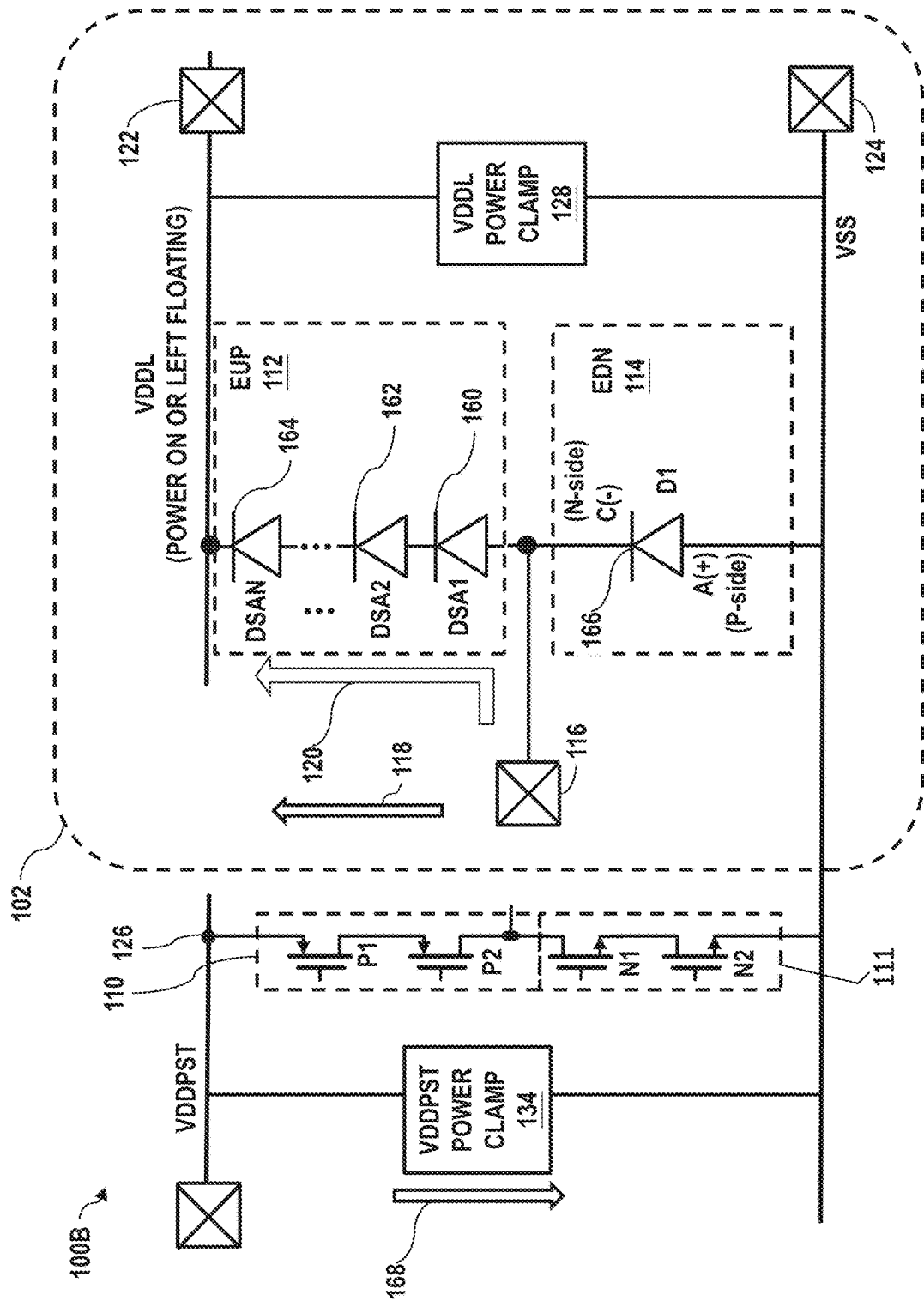
FIG. 1B is a schematic diagram of an ESD protection network, in accordance with some embodiments.

FIG. 1B is a block diagram of an ESD protection network 100B, in accordance with some embodiments.

FIG. 1B is a version of FIG. 1A. In particular, in some respects, FIG. 1B is simplified with respect to FIG. 1A in a sense that some of the components of FIG. 1A are not reproduced in FIG. 1B for purposes of simplifying illustration. In some respects, FIG. 1B is more detailed than FIG. 1A, e.g., see the discussion below of EUP device 112 and EDN device 114. Reference numbers which are the same in each of FIGS. 1B and 1A correspondingly represent the same elements.

EDN device 114 includes a diode D1 166. EUP device 112 includes diodes DSA1 160, DSA2 162, . . . , DSAN 164N. Diode D1 166 is described as a reversed diode relative to a voltage across diode D1 166 from I/O pad 116 to node 124 at/having VSS. A diode is a two-terminal electronic component that conducts current primarily in one direction (asymmetric conductance). A diode has low (ideally zero) resistance in one direction, and high (ideally infinite) resistance in the other. A semiconductor diode is a crystalline piece of semiconductor material with a p-n junction connected to two electrical terminals.

A p-n junction diode is made of semiconductor material, e.g., usually silicon, but germanium and gallium arsenide are also used as well as other suitable materials within the contemplated scope of the disclosure. Impurities are added to the diode to create a first region on one side that contains negative charge carriers (electrons), called an n-type semiconductor, and a second region on the other side that contains positive charge carriers (holes), called a p-type semiconductor. In response to the n-type and p-type materials being attached together, a momentary flow of electrons occurs from the N-side to the P-side resulting in a third region between the first and second regions where no charge carriers are present. This region is called the depletion region because there are no charge carriers (neither electrons nor holes). The diode's terminals are attached to the n-type and p-type regions. The boundary between these two regions is referred to as a p-n junction, and is responsible for the electrical behavior exhibited by a diode. Below a voltage referred to as the knee voltage or cut-in voltage, only little if any forward current is conducted by the diode. At the knee voltage, the diode starts to conduct significantly, exhibiting an exponential relationship voltage vs current. The knee voltage is equal to the barrier potential of the diode's p-n junction. In response to an electrical potential difference in which a voltage applied to the P-side (the anode A+) is higher than a voltage applied to the N-side (the cathode C−), and wherein the electrical potential difference is also equal to or greater than the knee voltage, the p-n junction allows electrons to flow through the depletion region from the N-type side to the P-type side. In response to the opposite electrical potential difference, in which the voltage applied to the P-side (the anode A+) is lower than the voltage applied to the N-side (the cathode C−) and the voltage difference is less than the knee voltage, the p-n junction allows little if any electrons to flow in the opposite direction, creating, in a sense, an electrical check valve.

In EDN device 114, diode D1 166 is a reversed diode with the cathode connected to I/O pad 116 and the anode connected to node 124 at/having VSS.

EUP device 112 includes a string of N serially-connected diodes DSA1 160, DSA2 162 through DSAN 164, where N≥1, from I/O pad 116 to node 122 at/having VDDL. In EUP device 112, regarding diode DSA1 160, the anode is connected to I/O pad 116 and the cathode is connected to the anode of diode DSA 162. The cathode of diode DSA 162 is connected to the next diode (not shown) in the string of N diodes in EUP device 112. The cathode of the penultimate diode (not shown) in the string of N diodes in EUP device 112 is connected the anode of diode 164. The cathode of diode 164 is connected to the node 122 at/having VDDL. The cascaded diodes number (N) depends on a voltage difference Vδ1 between VPAD and VDDL. More particularly, N is directly proportional to Vδ1. As Vδ increases, so does N. In FIG. 1B, each of the diodes DSA1 160, DSA2 162 through DSAN 164 has substantially the same knee voltage, e.g., a reference voltage VK. The number N is an integer and is equal to or greater than one plus a floor function applied to a ratio of the difference Δ divided by VK such that $$1 + \left(\frac{\Delta}{VK}\right) \leq N.$$

Eq. (1) In FIG. 1B, it is assumed that diode D1 166 has substantially the same knee voltage, e.g., a reference voltage VK. Relative to a reverse voltage across diode D1 166 from I/O pad 116 to node 124 at/having VSS, a breakdown voltage of diode D1 166, VB_D1, is VB_D1≥VK*N.

Figure 2A:
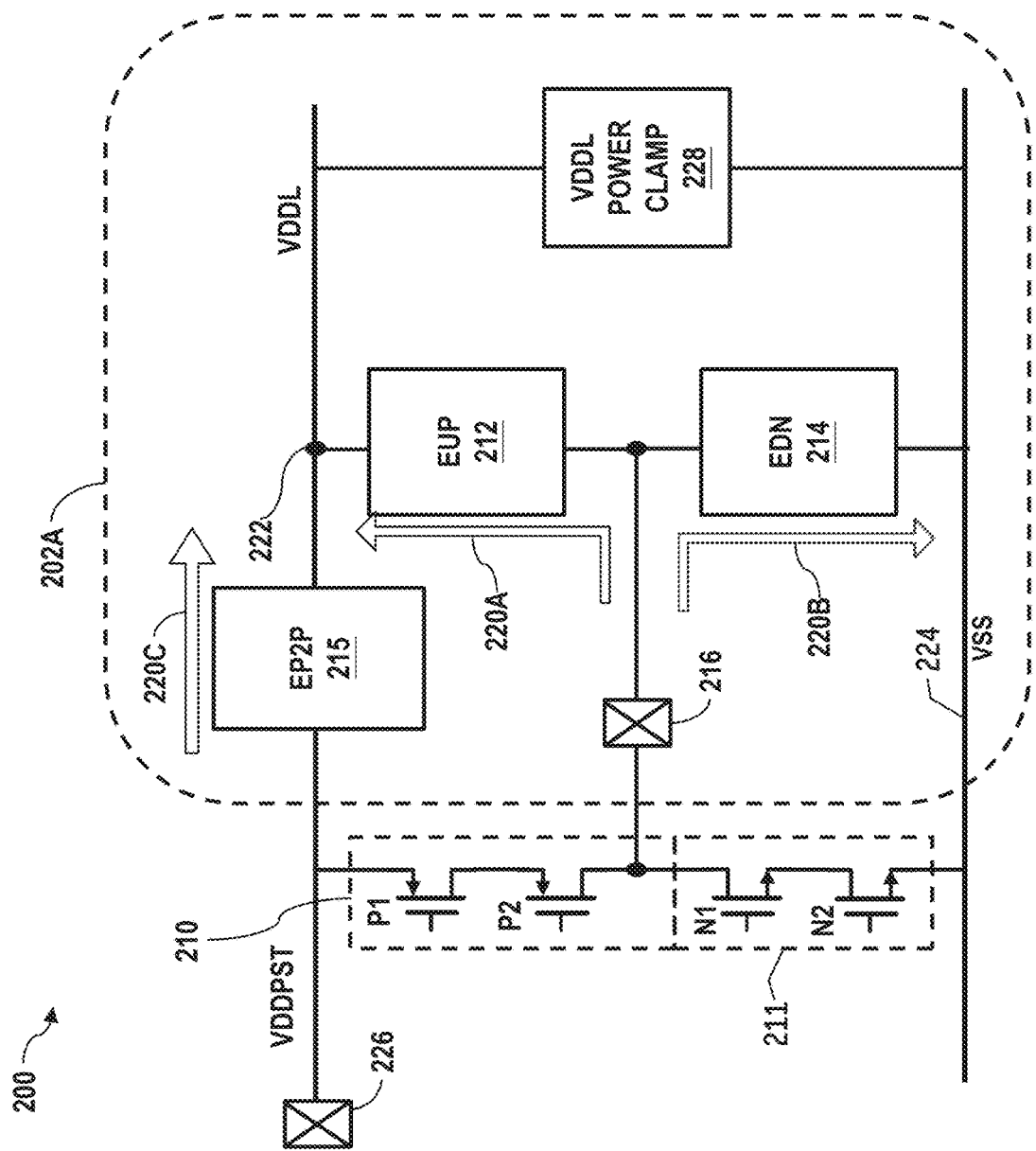
FIG. 2A is a block diagram of an ESD protection network, in accordance with some embodiments.

FIG. 2A is a block diagram of an ESD protection network 200, in accordance with some embodiments.

In some embodiments, ESD protection network 200 is like ESD protection network 100B of FIG. 1B. FIG. 2A uses 2-series numbering whereas FIG. 1A uses 1-series numbering. In some embodiments, 2-series numbers in FIG. 2A that correspond to 1-series numbers in FIG. 1A indicate the same elements in FIG. 2A as in FIG. 1A.

EDS protection network 200 includes a fail-safe I/O ESD circuit 202A, I/O circuitry 136 (not shown but see FIG. 1A), a core logic circuit (not shown but see FIG. 1A), and a post-driver stack. The post-driver stack includes an upper branch 210 and a lower branch 211.

In FIG. 2A, VDDPST power clamp 134 is removed as compared to FIG. 1A, but ESD power to power discharge EP2P device 215 is included as compared to FIG. 1A. In some embodiments, the term EP2P is an acronym for ESD power to power-discharge. EP2P device 215 is between node 226 at/having VDDPST and node 222 at/having VDDL. In FIG. 1A, in some circumstances, VDDPST power clamp 134 has high leakage current, e.g., in an overdrive design (where the VDDPST operation voltage is larger than device voltage VDDL). The higher the voltage that can be clamped by VDDPST power clamp 134, the higher the associated leakage current. EP2P device 215 takes over the ESD-protection role otherwise taken by VDDPST power clamp 134 but also exhibits low leakage current.

EP2P device 215 has low leakage current in both normal operation and fail-safe operation. During fail-safe operation, where VDDPST is powered down to zero volts by a power management unit (PMU) (not shown), VDDL is either powered on by the PMU or is left floating and biased by any voltage coming through EUP device 212. VDDL leakage currents include leakage current Iup 220A from the post-driver stack and through EUP device 212, leakage current Idn 220B from the post-driver stack and through EDN device 214, and VDDPST-to-VDDL leakage current IP2L 220C. In some embodiments, to avoid stress on other devices, the value of VDDL is set to be greater than or equal to VPAD less the device operation voltage (e.g., operation voltage of fail-safe I/O ESD circuit 202A). In some embodiments, during a fail-safe event, EUP device 212 and EP2P device 215 reduce a value of the ESD voltage on I/O pad 216 so that the value of the ESD voltage is reduced/dissipated from VPAD to be less than or equal to VDDL after passing through EUP device 212 and EP2P device 215. Current Idn 220B is also dissipated through EDN device 214. Such reduction/dissipation ensures that an ESD event does not send a high voltage from I/O pad 216 to node 222 which otherwise would raise the voltage on node 222 substantially above VDDL.

VDDL power clamp 228 of FIG. 2A operates similarly to VDDL power clamp 128 of FIG. 1A.

Regarding FIG. 2A, a method (in accordance with some embodiments) of protecting I/O circuitry includes: dissipating a voltage level of a first ESD on I/O pad 216; and dissipating a voltage level of a second ESD on a node 226; and wherein the dissipating a voltage of a first ESD includes passing a first current from I/O pad 216 through EUP device 212 to node 122 which reduces the voltage level of the first ESD to be at or below a reference voltage otherwise on node 122 but for the first ESD; and the dissipating a voltage level of a second ESD includes passing a second current from node 226 through EP2P device 215 to node 122 which reduces the voltage level of the second ESD to be at or below the reference voltage otherwise on node 122 but for the second ESD. Such a method further includes: passing the first current or the second current through VDDL power clamp 128 to node 124.

Figure 2B:
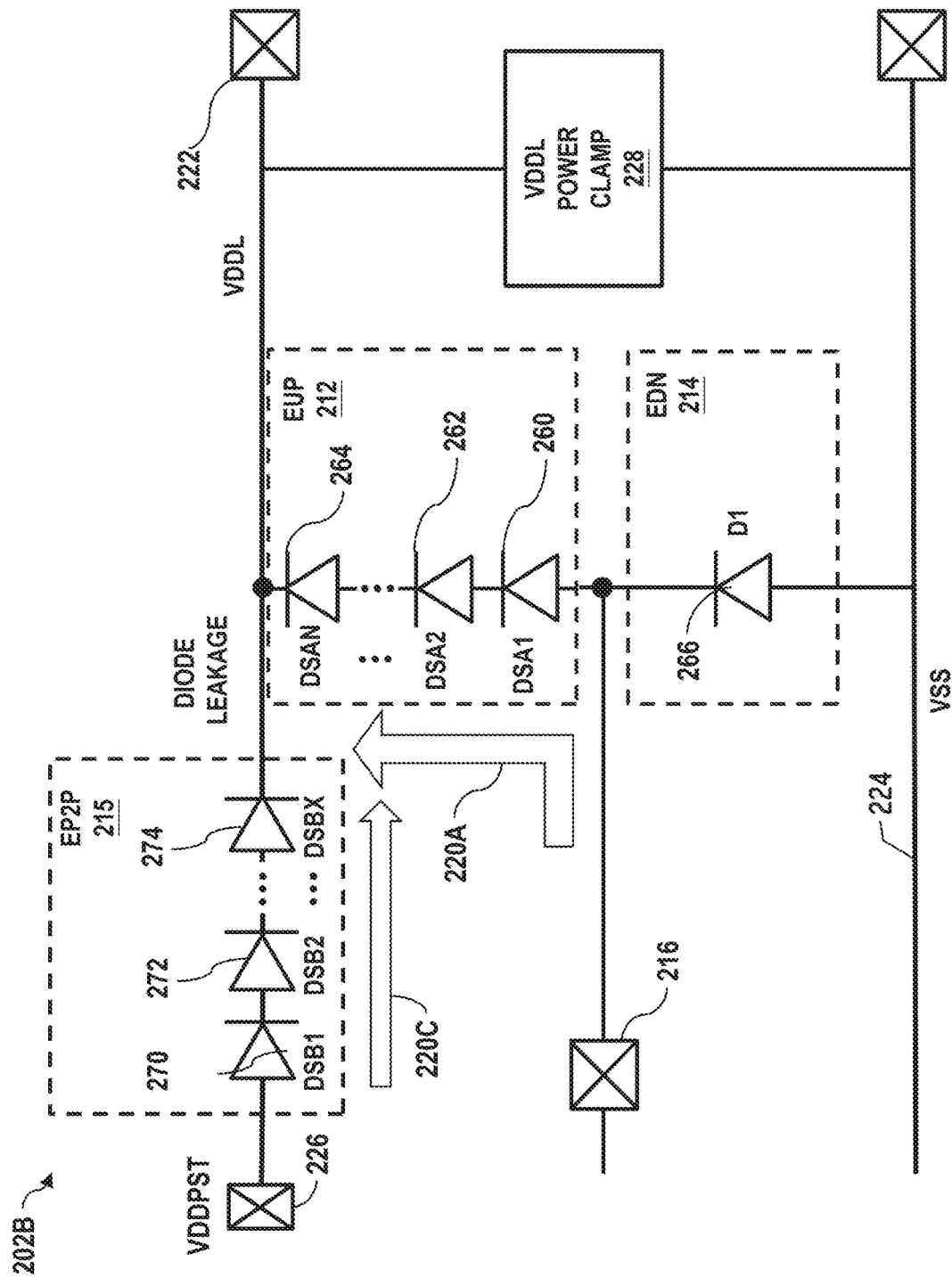
FIG. 2B is a schematic diagram of a fail-safe I/O ESD circuit, in accordance with some embodiments.

FIG. 2B is a schematic diagram of a fail-safe I/O ESD circuit 202B, in accordance with some embodiments.

FIG. 2B is a version of FIG. 2A. In particular, in some respects, FIG. 2B is simplified with respect to FIG. 2A in a sense that some of the components of FIG. 2A are not reproduced in FIG. 2B for purposes of simplifying illustration. In some respects, FIG. 2B is more detailed than FIG. 2A, e.g., see the discussion below of EUP device 212 and EDN device 214.

EP2P device 215 includes a string of X serially-connected diodes DSB1 270, DSB2 272, . . . , through DSBX 274, where X is an integer and X≥1. The cascaded diodes number (X) depends on a voltage difference Vδ2 between VDDPST and VDDL. More particularly, X is directly proportional to Vδ2. As Vδ2 increases, so does X.

In FIG. 2B, each of the diodes DSB1 270, DSB2 272 through DSBX 274 has substantially the same knee voltage, e.g., a reference voltage VK. The number X is equal to or greater than one plus a floor function applied to a ratio of the difference Δ divided by VK such that $$1 + \left(\frac{\Delta}{VK}\right) \leq X. \qquad \text{Eq. (2)}$$

In FIG. 2B, it is assumed that diode D1 266 has substantially the same knee voltage, e.g., a reference voltage VK. Relative to a reverse voltage across diode D1 266 from I/O pad 216 to node 224 at/having VSS, a breakdown voltage of diode D1 266, VB_D1, is VB_D1≥VK*N.

EUP device 212 includes diodes DSA1 260, DSA2 262, ..., DSAN 264 and operates similarly to EUP device 112, the latter including diodes DSA1 160, DSA2 162, ..., DSAN 164. EDN device 214 includes diode D1 266 and operates similarly to EDN device 114, the latter including diode D1 166. VDDL power clamp 228 operates similarly to VDDL power clamp 128.

In some embodiments, and in comparison to other approaches, e.g., drain ballasting, fail-safe I/O ESD circuit 202B has a benefit of reduced leakage current during a fail-safe operation.

In a non-limiting example in which the number N of diodes in EUP device 212 is N=1 and the number of diodes X in EP2P device 215 is X=1, and under voltage conditions in which VDDPST≈1.41*VDDL (e.g., VDDPST≈1.2 V and VDDL≈0.85 V), and under a temperature condition in which the temperature is low (e.g., ≈25° C.), at least some embodiments exhibit a reduction in leakage current of about 79.2% as compared to the other approach, e.g., drain ballasting.

In another non-limiting example in which the number N of diodes in EUP device 212 is N=1 and the number of diodes X in EP2P device 215 is X=1, and under voltage conditions in which VDDPST≈1.41*VDDL (e.g., VDDPST≈1.2 V and VDDL≈0.85 V), and under a temperature condition in which the temperature is high (e.g., ≈125° C.), at least some embodiments exhibit a reduction in leakage current of about 96.8% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.41*VDDL (e.g., VDDPST≈1.2 V and VDDL≈0.85 V), and under a temperature condition in which the temperature is low (e.g., ≈25° C.), at least some embodiments exhibit a reduction in leakage current of about 99.3% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.41*VDDL (e.g., VDDPST≈1.2 V and VDDL≈0.85 V), and under a temperature condition in which the temperature is high (e.g., ≈125° C.), at least some embodiments exhibit a reduction in leakage current of about 99.6% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.56*VDDL (e.g., VDDPST≈1.26 V and VDDL≈0.8075 V), and under a temperature condition in which the temperature is low (e.g., ≈25° C.), at least some embodiments exhibit a reduction in leakage current of about 97.9% as compared to the other approach, e.g., drain ballasting.

In another non-limiting example in which the number N of diodes in EUP device 212 is N=1 and the number of diodes X in EP2P device 215 is X=1, and under voltage conditions in which VDDPST≈1.56*VDDL (e.g., VDDPST≈1.26 V and VDDL≈0.8075 V), and under a temperature condition in which the temperature is high (e.g., ≈125° C.), at least some embodiments exhibit a reduction in leakage current of about 76.3% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.56*VDDL (e.g., VDDPST≈1.26 V and VDDL≈0.8075 V), and under a temperature condition in which the temperature is low (e.g., ≈125° C.), at least some embodiments exhibit a reduction in leakage current of about 99.1% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.73*VDDL (e.g., VDDPST≈1.32 V and VDDL≈0.765 V), and under a temperature condition in which the temperature is low (e.g., ≈25° C.), at least some embodiments exhibit a reduction in leakage current of about 93.9% as compared to the other approach, e.g., drain ballasting.

In another non-limiting example in which the number N of diodes in EUP device 212 is N=2 and the number of diodes X in EP2P device 215 is X=1, and under voltage conditions in which VDDPST≈1.73*VDDL (e.g., VDDPST≈1.32 V and VDDL≈0.765 V), and under a temperature condition in which the temperature is low (e.g., ≈125° C.), at least some embodiments exhibit a reduction in leakage current of about 97.8% as compared to the other approach, e.g., drain ballasting.

Figure 3:
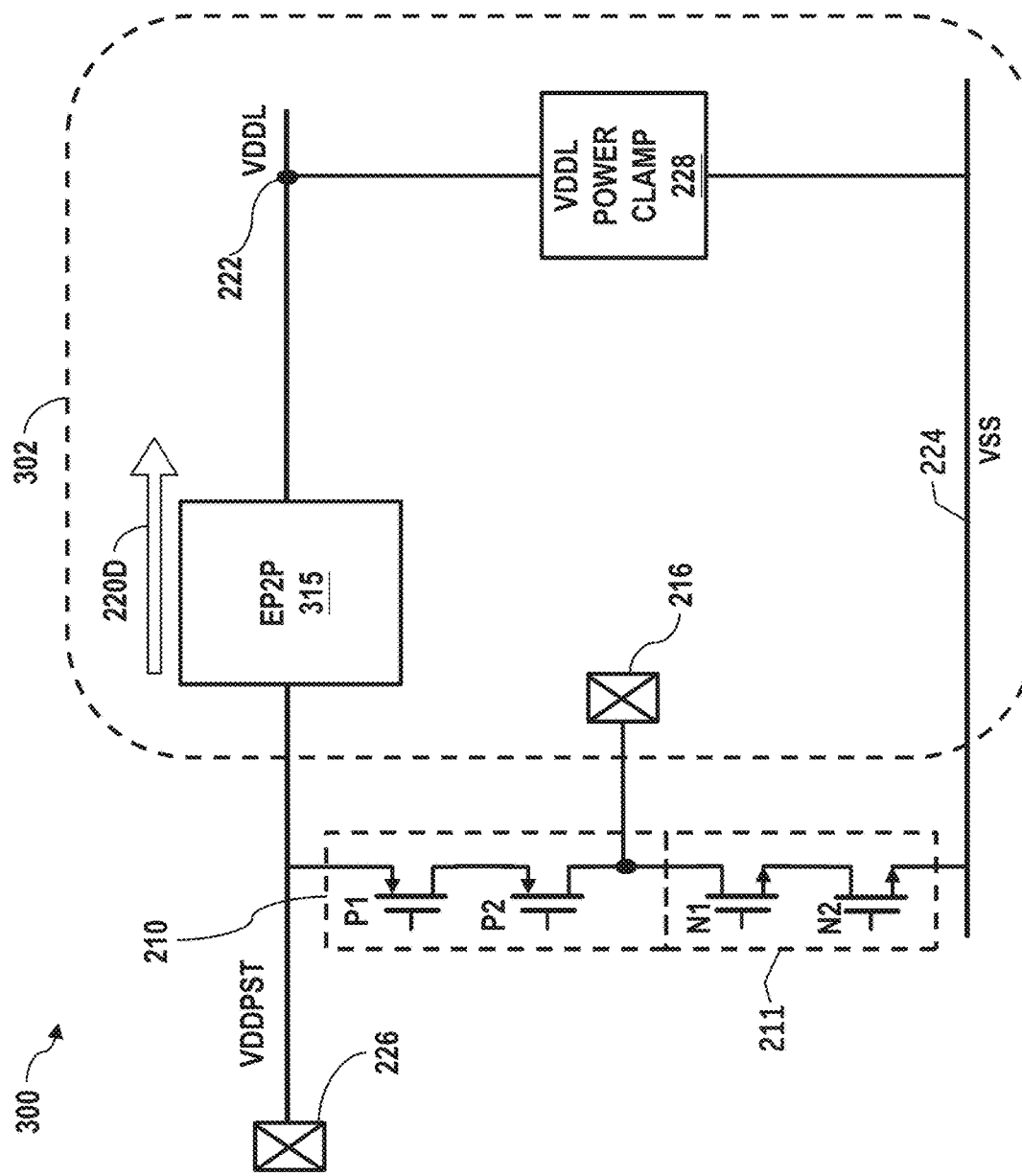
FIG. 3 is a block diagram of an ESD protection network, in accordance with some embodiments.

FIG. 3 is a block diagram of an ESD protection network 300, in accordance with some embodiments.

In some embodiments, ESD protection network 300 is like ESD protection network 200 of FIG. 2A, i.e., FIG. 3 is a version of FIG. 2A. In particular, FIG. 3 includes fewer components than FIG. 2A. FIG. 3 uses 3-series numbering whereas FIG. 2A uses 2-series numbering. In some embodiments, 3-series numbers in FIG. 3 that correspond to 2-series numbers in FIG. 2A indicate the same elements in FIG. 3 as in FIG. 2A.

EDS protection network 300 includes a fail-safe I/O ESD circuit 302, I/O circuitry (not shown but see FIG. 1A), a core logic circuit (not shown but see FIG. 1A), and a post-driver stack, where the post-driver stack includes upper branch 210 and lower branch 211.

In FIG. 3, EUP 212 and EDN 214 are removed as compared to FIG. 2A, but ESD power to power discharge (EP2P) device 315 is included in between node 226 at/having VDDPST and node 222 at/having VDDL. EP2P device 315 configured, and operates, similarly with respect to EP2P device 215 of FIGS. 2A-2B.

EP2P device 315 has low current leakage in both normal operation and fail-safe operation. During fail-safe operation, where VDDPST is powered down to zero volts by the PMU (not shown), VDDL is either powered on by a power management unit (PMU) or left floating.

During fail-safe operation, EP2P device 315 and VDDL power clamp 228 shunt excess voltage to ground through power rail VDDL. During normal operation, EP2P device 315 exhibits a leakage current IP2L 220D. Nevertheless, leakage current IP2L 220D is smaller than a leakage current of another approach which does not use EP2P device 315 but instead uses only a power clamp similar to VDDPST power clamp 134 of FIG. 1A.

In a non-limiting example in which the number of diodes X in EP2P device 315 is where X=1, and under voltage conditions in which VDDPST≈1.41*VDDL (e.g., VDDPST≈1.2 V and VDDL≈0.85 V), and under a temperature condition in which the temperature≈25° C., at least some embodiments exhibit a reduction in leakage current of about 98.2% as compared to the other approach.

In a non-limiting example in which the number of diodes X in EP2P device 315 is where X=1, and under voltage conditions in which VDDPST≈1.41*VDDL (e.g., VDDPST≈1.2 V and VDDL≈0.85 V), and under a temperature condition in which the temperature≈40° C., at least some embodiments exhibit a reduction in leakage current of about 97.9% as compared to the other approach.

In a non-limiting example in which the number of diodes X in EP2P device 315 is where X=1, and under voltage conditions in which VDDPST≈1.41*VDDL (e.g., VDDPST≈1.2 V and VDDL≈0.85 V), and under a temperature condition in which the temperature≈85° C., at least some embodiments exhibit a reduction in leakage current of about 98.1% as compared to the other approach.

In a non-limiting example in which the number of diodes X in EP2P device 315 is where X=1, and under voltage conditions in which VDDPST≈1.41*VDDL (e.g., VDDPST≈1.2 V and VDDL≈0.85 V), and under a temperature condition in which the temperature≈125° C., at least some embodiments exhibit a reduction in leakage current of about 98.8% as compared to the other approach.

Regarding FIG. 3, a method (in accordance with some embodiments) of protecting I/O circuitry includes: dissipating a voltage level of a first ESD on a node 226; and wherein the dissipating a voltage level of a first ESD includes passing a first current from node 226 through EP2P device 215 to node 122 which reduces the voltage level of the first ESD voltage to be at or below a reference voltage otherwise on node 122. Such a method further includes: passing the first current through VDDL power clamp 128 to node 124.

Figure 4:
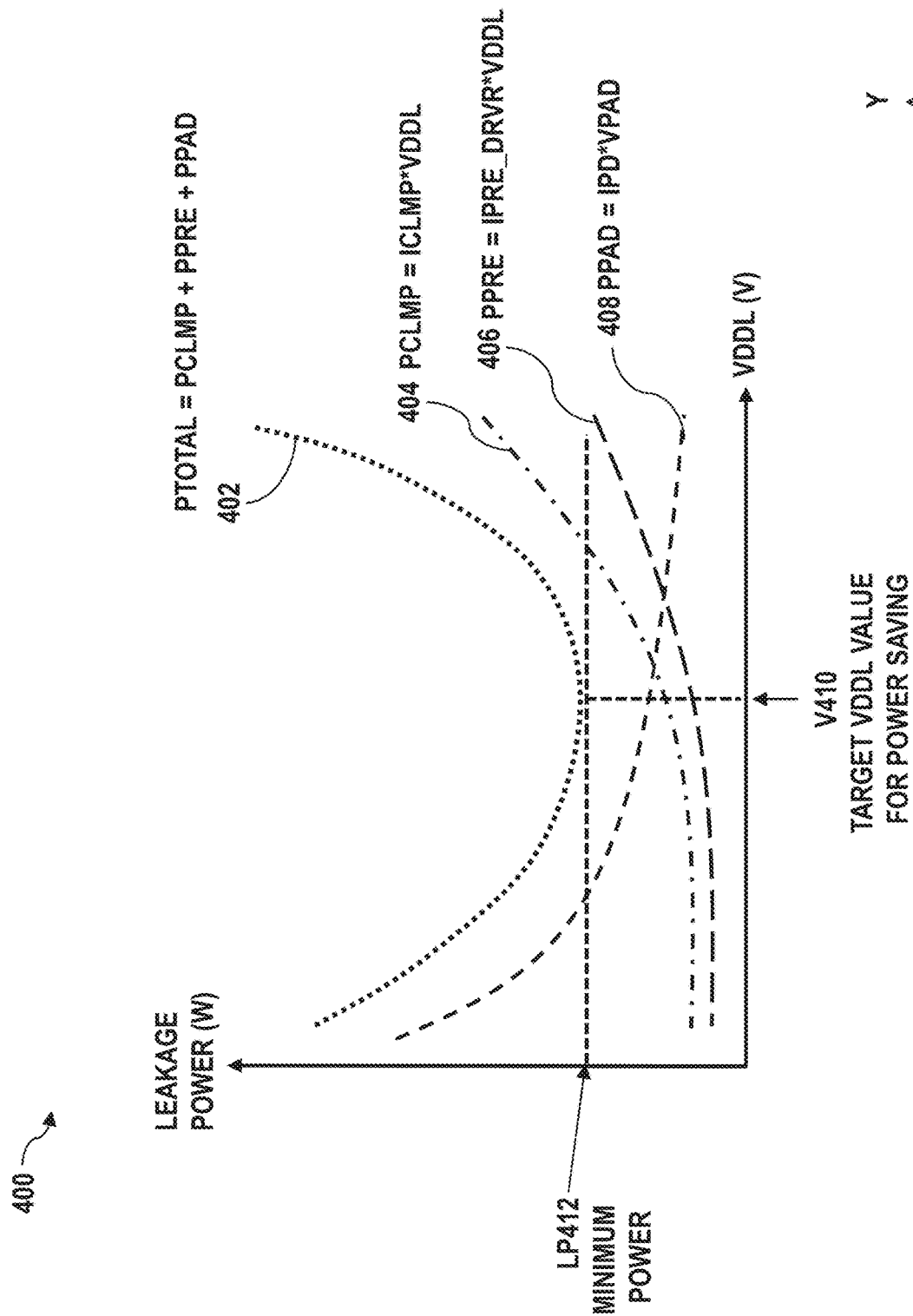
FIG. 4 is a plot of curved line segments, in accordance with some embodiments.

FIG. 4 is a plot 400 of curved line segments, in accordance with some embodiments.

Plot 400 relates voltage VDDL (in units of volts) on the X-axis to leakage power (in units of watts) on the Y-axis. Plot 400 includes curves 402, 404, 406 and 408.

Curve 404 represents the product of the current of a VDDL power clamp (ICLMP, e.g., Iclamp 129) and voltage VDDL. Accordingly, curve 404 is labeled PCLMP, and wherein PCLMP=ICLMP*VDDL. Curve 406 represents the product of the current of a level shifter (IPRE_DRVR, e.g., Ipre 148) and voltage VDDL. Accordingly, curve 406 is labeled PPRE, and wherein PPRE=IPRE_DRVR*VDDL. Curve 408 represents the product of the current at the I/O pad (IPD, e.g., Istk_L 121) and the voltage (VPAD) at the I/O pad (e.g., I/O pad 116). Accordingly, curve 408 is labeled PPAD, and wherein PPAD=IPD*VPAD. Curve 402 represents the sum of curves 404, 406, and 408. Accordingly, curve 402 is labeled as PTOTL.

Curves 404 and 406 have positive slopes whereas curve 408 has a negative slope. As a result, curve 402 has an open, upward shape. The lowest point of curve 402 represents a minimum value of power LP412 dissipated to leakage current in an ESD protection network such as ESD protection network 100A, or the like. The value of VDDL corresponding to LP412 is V410. In some embodiments, setting VDDL to V410 reduces, if not minimizes, leakage current in an ESD protection network such as ESD protection network 100A, or the like.

Regarding FIG. 4, a method (in accordance with some embodiments) of configuring an ESD protection network such as ESD protection network 100A, or the like, to reduce (if not minimize) leakage current includes: plotting a curve 402 which is the sum of curves 404, 406 and 408; determining a minimum value of leakage power on curve 402; extracting the value of VDDL that corresponds to the minimum value of curve 402; and setting that value of VDDL in the ESD protection network equal to the value of the value of VDDL that corresponds to the minimum value of curve 402.

Figure 5:
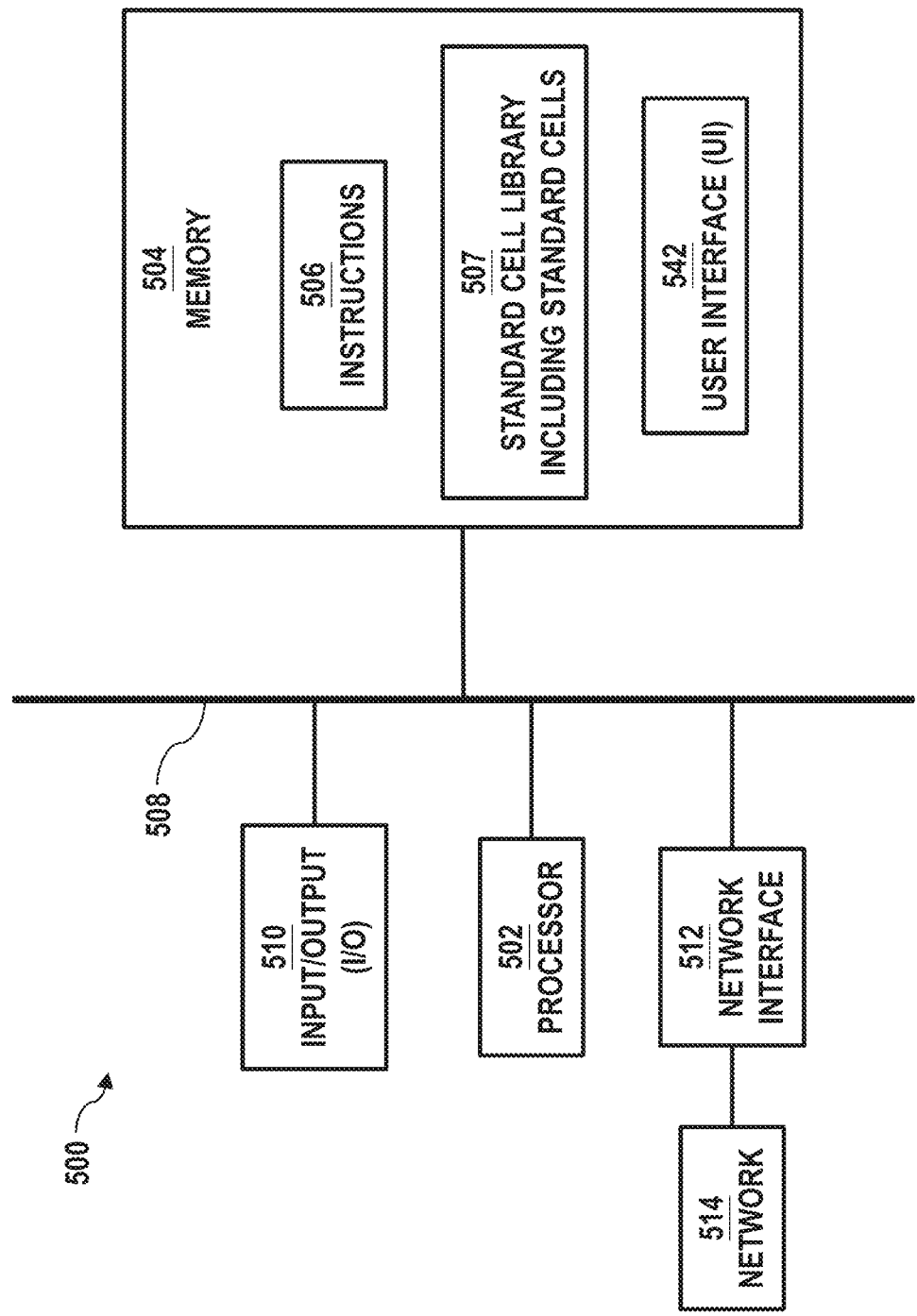
FIG. 5 is a block diagram of an electronic design automation (EDA) system in accordance with some embodiments.
Figure 6:
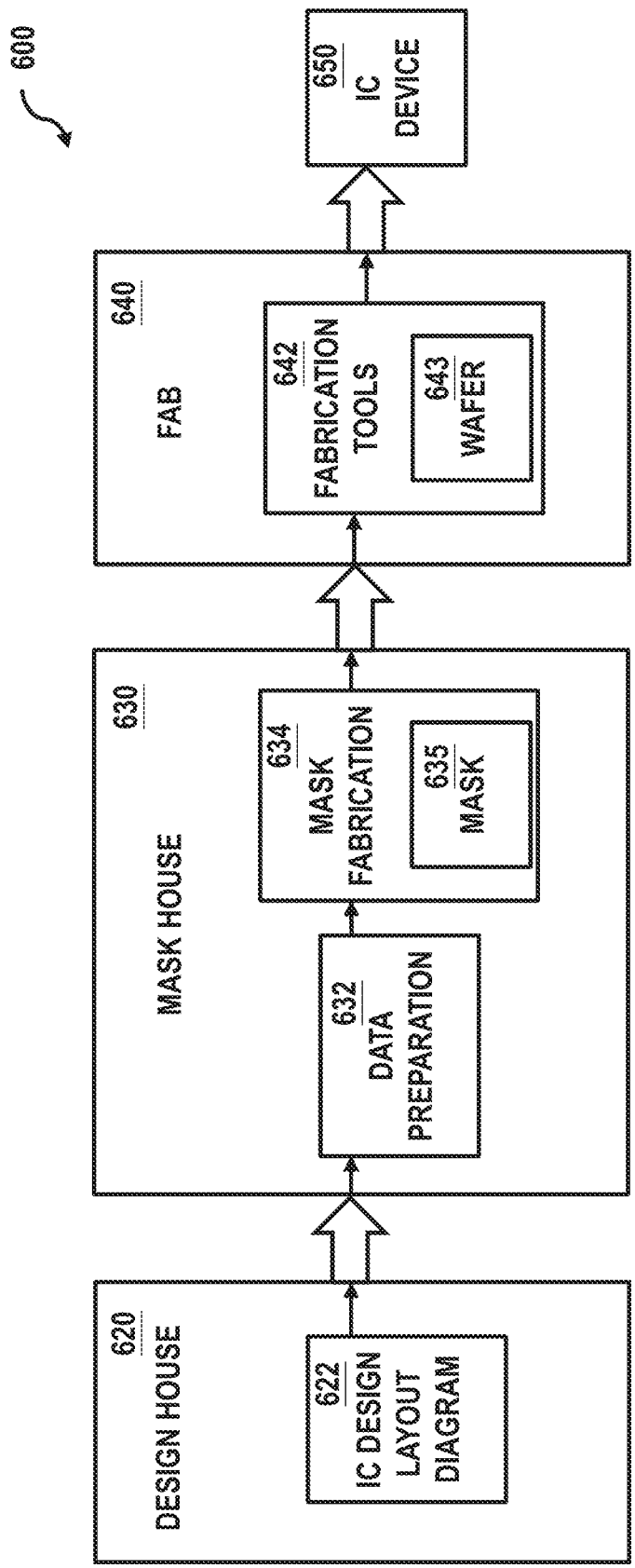
FIG. 6 is a block diagram of an integrated circuit (IC) manufacturing system, and an IC manufacturing flow associated therewith, in accordance with some embodiments.
Figure 7:
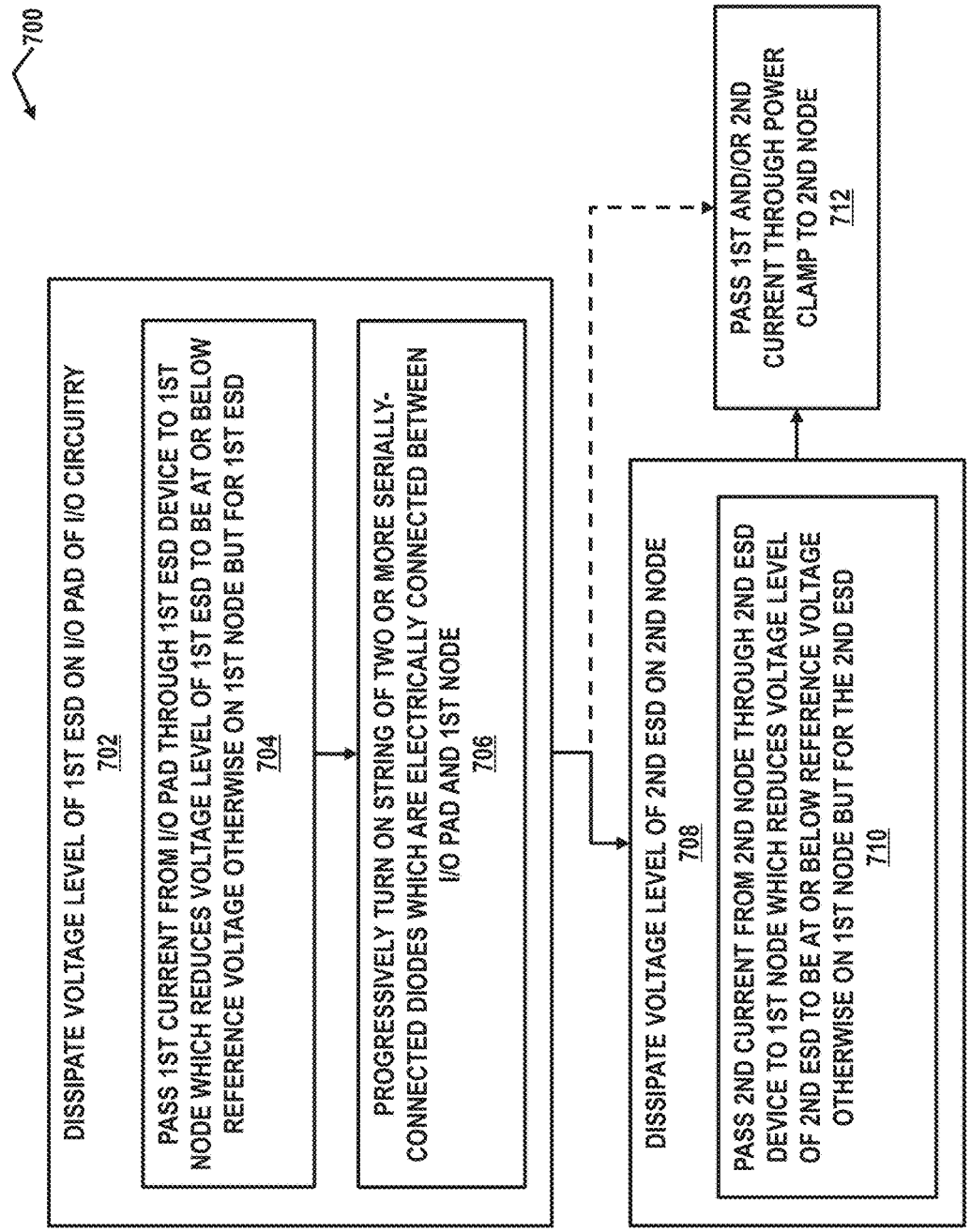
FIG. 7 is a flow diagram of a method, in accordance with some embodiments.

Next, before discussing FIGS. 5-6, discussion turns to FIG. 7.

FIG. 7 is a flow diagram of a method 700, in accordance with some embodiments.

More particularly, the flowchart of FIG. 7 represents a method of protecting input/output (I/O) circuitry. While the blocks of method 700 are discussed and shown as having a particular order, each block in method 700 is configured to be performed in any order unless specifically called out otherwise. Method 700 is implemented as a set of blocks, such as blocks 702 through 712.

In block 702 of method 700, a voltage level of a first ESD on I/O pad of the I/O circuitry is dissipated. Examples of the I/O pad include I/O pad 166, 266, or the like. Block 702 includes blocks 704-706. An example of the I/O circuitry is I/O circuitry 136, or the like. Flow proceeds within block 702 to block 704.

In block 704 of method 702, a first current is passed from the I/O pad through a first ESD device to a first node which reduces the voltage level of the first ESD to be at or below a reference voltage otherwise on the first node but for the first ESD. Examples of the first current include currents 120 of FIGS. 1A-1B, 220A of FIGS. 2A-2B, or the like. Examples of the first ESD device include EUP device 112 of FIGS. 1A-1B, 212 of FIGS. 2A-2B, or the like. Examples of the first node include nodes 122 n FIGS. 1A-1B, 222 in FIGS. 2A-2B, or the like. An example of the reference voltage otherwise on the first node but for the first ESD is voltage VDDL in FIGS. 1A-1B and 2A-2B, or the like. Flow proceeds from block 704 to block 706.

In block 706 of method 700, the dissipating a voltage level of a first ESD includes progressively turning on a string of two or more serially-connected diodes which are electrically connected between the I/O pad and the first node. Examples of the string of two or more serially-connected diodes which are electrically connected between the I/O pad and the first node include didoes 160-164 of FIG. 1B, 270-274 of FIG. 2B, or the like. In a non-limiting operation example, during a normal mode of block, which is free of an ESD-event, limiting leakage current flows between the I/O pad and the first node by forcing a voltage which induces the leakage current to progressively turn on a string of two or more serially-connected diodes which are electrically connected between the I/O pad and the first node. From block 706, flow exits block 702 and proceeds to block 708. In some embodiments, method 700 bypasses block 708 and flow proceeds from block 706 to block 712.

In block 708 of method 700, a voltage level of a second ESD on a second node is dissipated. An example of the second node is node 226 in each of FIGS. 2A-2B, or the like. Block 708 includes block 710. Within block 708, flow proceeds to block 710.

In block 710 of method 700, the dissipating a voltage level of a second ESD includes passing a second current from the second node through a second ESD device to the first node which reduces the voltage level of the second ESD to be at or below the reference voltage otherwise on the first node but for the second ESD. Examples of the second current include currents 220C of FIGS. 2A-2B, or the like. An example of the reference voltage otherwise on the first node but for the second ESD is voltage VDDL in FIGS. 2A-2B, or the like. In a non-limiting operation example, the dissipating a voltage level of a second ESD includes progressively turning on a string of two or more serially-connected diodes which are electrically connected between the second node and the first node. In another non-limiting operation example, during a normal mode of block, which is free of an ESD-event, limiting leakage current flows between the I/O pad and the first node by forcing a voltage which induces the leakage current to progressively turn on a string of two or more serially-connected diodes which are electrically connected between the second node and the first node. Flow exits block 710 and proceeds to block 712.

In some embodiments, method 700 bypasses block 702 such that flow in method 700 begins at block 708. In such embodiments, an example of the second node is node 226 in FIG. 3, or the like. Also, in such embodiments, regarding block 710, an example of the second current is current 220D of FIG. 3, or the like. An example of the reference voltage otherwise on the first node but for the second ESD is voltage VDDL in FIG. 3, or the like. Again, flow exits block 710 and proceeds to block 712.

In block 712 of method 700, the first current and/or the second current is passed through a power clamp to a second node. Examples of the power clamp include power clamps 128 in FIGS. 1A-1B, 228 in FIGS. 2A-2B & 3, or the like. An example of the second current is current 129 in FIGS. 1A-1B, 2A-2B, 3, or the like. Examples of the second node include node 124 in FIGS. 1A-1B, 224 in FIGS. 2A-2B & 3, or the like.

As noted, in some embodiments, method 700 bypasses block 702 and flow begins at block 708.

FIG. 5 is a block diagram of an electronic design automation (EDA) system 500 in accordance with some embodiments.

In some embodiments, EDA system 500 is a general-purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 represents (at least in part) an EDA tool which implements a portion or all in accordance with one or more embodiments (hereinafter, the noted processes and/or methods).

Processor 502 is electrically coupled to computer-readable storage medium 504 via a bus 508. Processor 502 is further electrically coupled to an I/O interface 510 by bus 508. A network interface 512 is further electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 to cause system 500 to be usable for performing a portion or all the noted processes and/or methods. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores computer program code 506 configured to cause system 500 (where such execution represents (at least in part) the EDA tool) to be usable for performing a portion or all the noted processes and/or methods. In one or more embodiments, storage medium 504 further stores information which facilitates performing a portion or all the noted processes and/or methods. In one or more embodiments, storage medium 504 stores library 507 of standard cells including such standard cells as disclosed herein.

EDA system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

EDA system 500 further includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all noted processes and/or methods, is implemented in two or more systems 500.

System 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. EDA system 500 is configured to receive information related to a UI through I/O interface 510. The information is stored in computer-readable storage medium 504 as user interface (UI) 542.

In some embodiments, a portion or all the noted processes and/or methods is implemented as a standalone software application for execution by a processor. In some embodiments, a portion or all the noted processes and/or methods is implemented as a software application that is a part of an additional software application. In some embodiments, a portion or all the noted processes and/or methods is implemented as a plug-in to a software application. In some embodiments, at least one of the noted processes and/or methods is implemented as a software application that is a portion of an EDA tool. In some embodiments, a portion or all the noted processes and/or methods is implemented as a software application that is used by EDA system 500. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 6 is a block diagram of an integrated circuit (IC) manufacturing system 600, and an IC manufacturing flow associated therewith, in accordance with some embodiments.

In FIG. 6, IC manufacturing system 600 includes entities, such as a design house 620, a mask house 630, and an IC manufacturer/fabricator ("fab") 640, that interact with one another in the design, development, and manufacturing cycles and/or services related to manufacturing an IC device 650. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 620, mask house 630, and IC fab 640 is owned by a single larger company. In some embodiments, two or more of design house 620, mask house 630, and IC fab 640 coexist in a common facility and use common resources.

Design house (or design team) 620 generates an IC design layout 622. IC design layout 622 includes various geometrical patterns designed for an IC device 650. The geometrical patterns correspond to patterns of metal, oxide, or semiconductor layers that make up the various components of IC device 650 to be fabricated. The various layers combine to form various IC features. For example, a portion of IC design layout 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout 622. The design procedure includes one or more of logic design, physical design or place and route. IC design layout 622 is presented in one or more data files having information of the geometrical patterns. For example, IC design layout 622 is expressed in a GDSII file format or DFII file format.

Mask house 630 includes data preparation 632 and mask fabrication 634. Mask house 630 uses IC design layout 622 to manufacture one or more masks to be used for fabricating the various layers of IC device 650 according to IC design layout 622. Mask house 630 performs mask data preparation 632, where IC design layout 622 is translated into a representative data file ("RDF"). Mask data preparation 632 supplies the RDF to mask fabrication 634. Mask fabrication 634 includes a mask writer. A mask writer converts the RDF to an image on a substrate, such as a mask (reticle) or a semiconductor wafer. The design layout is manipulated by mask data preparation 632 to comply with characteristics of the mask writer and/or requirements of IC fab 640. In FIG. 6, mask data preparation 632, mask fabrication 634, and mask 635 are illustrated as separate elements. In some embodiments, mask data preparation 632 and mask fabrication 634 are collectively referred to as mask data preparation.

In some embodiments, mask data preparation 632 includes optical proximity correction (OPC) which uses lithography enhancement techniques to compensate for image errors, such as those that arise from diffraction, interference, other process effects and the like. OPC adjusts IC design layout 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 634, which undoes part of the modifications performed by OPC to meet mask creation rules.

In some embodiments, mask data preparation 632 includes lithography process checking (LPC) that simulates processing that is implemented by IC fab 640 to fabricate IC device 650. LPC simulates this processing based on IC design layout 622 to create a simulated manufactured device, such as IC device 650. The processing parameters in LPC simulation include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 622.

The above description of mask data preparation 632 has been simplified for the purposes of clarity. In some embodiments, data preparation 632 includes additional features such as a logic operation (LOP) to modify the IC design layout according to manufacturing rules. Additionally, the processes applied to IC design layout 622 during data preparation 632 may be executed in a variety of different orders.

After mask data preparation 632 and during mask fabrication 634, a mask 635 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 634 is used in a variety of processes. For example, such a mask(s) is used in an ion implantation process to form various doped regions in the semiconductor wafer, in an etching process to form various etching regions in the semiconductor wafer, and/or in other suitable processes.

IC fab 640 is an IC fabrication business that includes one or more manufacturing facilities for the fabrication of a variety of different IC products. In some embodiments, IC Fab 640 is a semiconductor foundry. For example, there may be a manufacturing facility for the front-end fabrication of a plurality of IC products (front-end-of-line (FEOL) fabrication), while a second manufacturing facility supplies the back-end fabrication for the interconnection and packaging of the IC products (back-end-of-line (BEOL) fabrication), and a third manufacturing facility may supply other services for the foundry business.

IC fab 640 uses the mask (or masks) fabricated by mask house 630 to fabricate IC device 650. Thus, IC fab 640 at least indirectly uses IC design layout 622 to fabricate IC device 650. In some embodiments, a semiconductor wafer 643 is fabricated by fabrication tools 642 using the mask (or masks) to form IC device 650. Semiconductor wafer 643 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, an electro-static discharge (ESD) protection network for an input/output (I/O) pad includes: a driver stack including a serially-connected upper branch and a lower branch, the upper branch being electrically connected between a first node that has a first reference voltage and the I/O pad, and the lower branch being electrically connected between the I/O pad and a second node that has a second reference voltage; a first ESD device electrically connected between the I/O pad and a third node that has a third reference voltage; and a power clamp between the third node and the second node.

In some embodiments, the protection network further includes a second ESD device electrically connected between the second node and the I/O pad. In some embodiments, the protection network further includes a third ESD device electrically connected between the third node and the I/O pad. In some embodiments, the third ESD device includes a diode that includes a diode cathode connected to the third reference voltage and a diode anode connected to the I/O pad and the second ESD device. In some embodiments, the second ESD device includes a number of N diodes connected in series, N being a positive integer and 2≤N; and the number N diodes are based on a difference between the second reference voltage and a voltage of the I/O pad. In some embodiments, the first ESD device includes a number of P diodes connected in series, P being a positive integer and 1≤P. In some embodiments, the upper branch of the driver stack includes series-connected positive-channel metal oxide semiconductor (PMOS) transistors between the first node and the I/O pad. In some embodiments, the lower branch of the driver stack includes series-connected negative-channel metal oxide semiconductor (NMOS) transistors between the I/O pad and the second node.

In some embodiments, an electro-static discharge (ESD) protection network for an input/output (I/O) pad includes a first ESD device electrically connected between a first node having a first reference voltage and the I/O pad; and a second ESD device electrically connected between a second node having a second reference voltage and the I/O pad; and wherein the first ESD device has a number N of diodes connected in series, N being a positive integer and 2≤N; and the number N is based on a difference between the first reference voltage and a voltage of the I/O pad.

In some embodiments, the number N of diodes are of a first size, the second ESD device includes a diode of a second size, and the second size is greater than N multiple of the first size. In some embodiments, the difference is referred to by a variable Δ; each of the diodes has substantially a same knee voltage as a reference voltage VK; and the number N is equal to or greater than one plus a floor function applied to a ratio of the difference Δ divided by VK such that $$1 + \left(\frac{\Delta}{VK}\right) \leq N.$$

In some embodiments, the protection network further includes a power clamp between the first node and the second node. In some embodiments, the protection network further includes a first group of series-connected transistors between a third node at a third reference voltage and the I/O pad. In some embodiments, the protection network further includes a second group of series-connected transistors between the I/O pad and the second node. In some embodiments, the protection network further includes a first power clamp between the third node and the second node. In some embodiments, the protection network further includes a second power clamp between the first node and the second node.

In some embodiments, a method (of protecting input/output (I/O) circuitry) includes: dissipating a voltage level of a first ESD on I/O pad of the I/O circuitry; and wherein the dissipating a voltage level of a first ESD includes passing a first current from the I/O pad through a first ESD device to a first node which reduces the voltage level of the first ESD to be at or below a reference voltage otherwise on the first node but for the first ESD.

In some embodiments, the dissipating a voltage level of a first ESD includes: progressively turning on a string of two or more serially-connected diodes which are electrically connected between the I/O pad and the first node. In some embodiments, the method further includes: during a normal mode of operation which is free of an ESD-event, limiting leakage current that flows between the I/O pad and the first node by forcing a voltage which induces the leakage current to progressively turn on a string of two or more serially-connected diodes which are electrically connected between the I/O pad and the first node. In some embodiments, the method further includes: dissipating a voltage level of a second ESD on a second node; and wherein the dissipating a voltage level of a second ESD includes passing a second current from the second node through a second ESD device to the first node which reduces the voltage level of the second ESD to be at or below the reference voltage otherwise on the first node but for the second ESD. In some embodiments, the dissipating a voltage level of a second ESD includes: progressively turning on a string of two or more serially-connected diodes which are electrically connected between the second node and the first node. In some embodiments, the method further includes: during a normal mode of operation which is free of an ESD-event, limiting leakage current that flows between the I/O pad and the first node by forcing a voltage which induces the leakage current to progressively turn on a string of two or more serially-connected diodes which are electrically connected between the second node and the first node. In some embodiments, the method further includes: passing the second current through a power clamp to a second node. In some embodiments, the method further includes: passing the first current through a power clamp to a second node.

In some embodiments, an electro-static discharge (ESD) protection network for an input/output (I/O) pad includes a first ESD device electrically connected between a first node having a first reference voltage and the I/O pad; a second ESD device electrically connected between a second node having a second reference voltage and the I/O pad; a first group of series-connected transistors between a third node having a third reference voltage and the I/O pad; a second group of series-connected transistors between the I/O pad and the second node; a power clamp between the first node and the second node; and a third ESD device electrically connected between the third node and the first node.

In some embodiments, the first ESD device has a number N of diodes connected in series, N being a positive integer and 2≤N. In some embodiments, the number N is based on a difference, Δ, between the first reference voltage and a voltage of the I/O pad. In some embodiments, each of the diodes has substantially a same knee voltage as a reference voltage VK; and the number N is equal to or greater than one plus a floor function applied to a ratio of the difference Δ divided by VK such that $$1+\left(\frac{\Delta}{VK}\right)\leq N.$$

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electro-static discharge (ESD) protection network for an input/output (I/O) pad, comprising:
a driver stack including a serially-connected upper branch and a lower branch, the upper branch being electrically connected between a first node that has a first reference voltage and the I/O pad, and the lower branch being electrically connected between the I/O pad and a second node that has a second reference voltage;
a first ESD device electrically connected between the I/O pad and a third node that has a third reference voltage, wherein the I/O pad is electrically connected between the first ESD device and the driver stack; and
a power clamp between the third node and the second node.

2. The ESD protection network of claim 1, further comprising:
a second ESD device electrically connected between the second node and the I/O pad.

3. The ESD protection network of claim 2, further comprising:
a third ESD device electrically connected between the third node and the I/O pad.

4. The ESD protection network of claim 3, wherein:
the third ESD device includes:
a diode that includes a diode cathode connected to the third reference voltage and a diode anode connected to the I/O pad and the second ESD device.

5. The ESD protection network of claim 1, wherein:
the first ESD device includes:
a number N diodes connected in series, N being a positive integer and 2≤N; and
the number N diodes are based on a difference between the first reference voltage and a voltage of the I/O pad.

6. The ESD protection network of claim 2, wherein:
the second ESD device includes:
a number P diodes connected in series, P being a positive integer and 1≤P.

7. The ESD protection network of claim 1, wherein:
the upper branch of the driver stack includes series-connected positive-channel metal oxide semiconductor (PMOS) transistors between the first node and the I/O pad.

8. The ESD protection network of claim 7, wherein:
the lower branch of the driver stack includes series-connected negative-channel metal oxide semiconductor (NMOS) transistors between the I/O pad and the second node.

9. An electro-static discharge (ESD) protection network for an input/output (I/O) pad, comprising:
a first ESD device electrically connected between a first node having a first reference voltage and the I/O pad, wherein the first reference voltage is electrically floating; and
a second ESD device electrically connected between a second node having a second reference voltage and the I/O pad; and
wherein:
the first ESD device has a number N of diodes connected in series, N being a positive integer and 2≤N; and
the number N is based on a difference between the first reference voltage and a voltage of the I/O pad.

10. The protection network of claim 9, wherein:
the number N of diodes are of a first size,
the second ESD device includes a diode of a second size, and
the second size is greater than N multiple of the first size.

11. The protection network of claim 9, wherein:
the difference is referred to by a variable Δ;
each of the diodes has substantially a same knee voltage as a reference voltage VK; and
the number N is equal to or greater than one plus a floor function applied to a ratio of the difference Δ divided by VK such that

1+(Δ/VK)≤N.

12. The protection network of claim 9, further comprising:
a power clamp between the first node and the second node.

13. The protection network of claim 9, further comprising:
a first group of series-connected transistors between a third node at a third reference voltage and the I/O pad.

14. The protection network of claim 13, further comprising:
a second group of series-connected transistors between the I/O pad and the second node.

15. The protection network of claim 14, further comprising:
a first power clamp between the third node and the second node.

16. The protection network of claim 15, further comprising:
a second power clamp between the first node and the second node.

17. A method of protecting input/output (I/O) circuitry, the method comprising:
dissipating a voltage level of a first ESD on I/O pad of the I/O circuitry; and
wherein the dissipating the voltage level of the first ESD includes:
passing a first current from the I/O pad through a first ESD device to a first node which reduces the voltage level of the first ESD to be at or below a reference voltage otherwise on the first node but for the first ESD, wherein the reference voltage otherwise on the first node is less than an operating voltage of the I/O circuitry and greater than a ground voltage of the I/O circuitry.

18. The method of claim 17, wherein the dissipating the voltage level of the first ESD includes:
progressively turning on a string of two or more serially-connected diodes which are electrically connected between the I/O pad and the first node.

19. The method of claim 17, further comprising:
dissipating a voltage level of a second ESD on a second node; and
wherein the dissipating the voltage level of the second ESD includes:
passing a second current from the second node through a second ESD device to the first node which reduces the voltage level of the second ESD to be at or below the reference voltage otherwise on the first node but for the second ESD.

20. The method of claim 17, further comprising:
passing the first current through a power clamp to a second node.

\* \* \* \* \*